US005712492A

United States Patent [19]

Kokubun

[11] Patent Number: 5,712,492

[45] Date of Patent: Jan. 27, 1998

[54] TRANSISTOR FOR CHECKING RADIATION-HARDENED TRANSISTOR

[75] Inventor: Tetsuya Kokubun, Tokyo, Japan

[73] Assignee: NEC Corporation, Tokyo, Japan

[21] Appl. No.: 685,668

[22] Filed: Jul. 24, 1996

[30] Foreign Application Priority Data

Jul. 25, 1995 [JP] Japan .................................... 7-209241

[51] Int. Cl.$^6$ ............................ H01L 29/78; H01L 23/58

[52] U.S. Cl. ............................ 257/48; 257/345; 257/399; 257/400; 257/652

[58] Field of Search .............................. 257/48, 345, 398, 257/399, 400, 652

[56] References Cited

U.S. PATENT DOCUMENTS 4,011,581 3/1977 Kubo et al. ............................ 257/399
4,785,343 11/1988 Nezu ....................................... 257/399
4,974,051 11/1990 Matloubian et al. .................. 257/398
5,498,894 3/1996 Kokubun ................................ 257/345

*Primary Examiner*—Gene M. Munson
*Attorney, Agent, or Firm*—Sughrue, Mion, Zinn, Macpeak & Seas, PLLC

[57] ABSTRACT

A checking transistor for checking selected regions a semiconductor substrate containing radiation-hardened semiconductor circuitry having a plurality of transistors according to the present invention comprises a source region of the other conductivity type and a drain region of the other conductivity type formed on the semiconductor substrate through the same fabrication steps as those used to fabricate usual transistors, a second impurity region of the one conductivity type formed between the source region and the drain region through the same fabrication steps as those used to fabricate the first impurity region, an oxide film formed on the source region, the drain region and the second impurity region, the oxide film having the same thickness as that of the second field oxide film, an insulating film provided on the oxide film, the insulating film having the same thickness as that of the interlayer insulating film and a gate. electrode provided on the insulating film.

6 Claims, 3 Drawing Sheets

14 10 7 7 12 14 7 11 14 34 7 14 28 7 13 26 14 28 34 7
2 2 1
5 4 3 6 1 27 29 27

FIG.1(a)
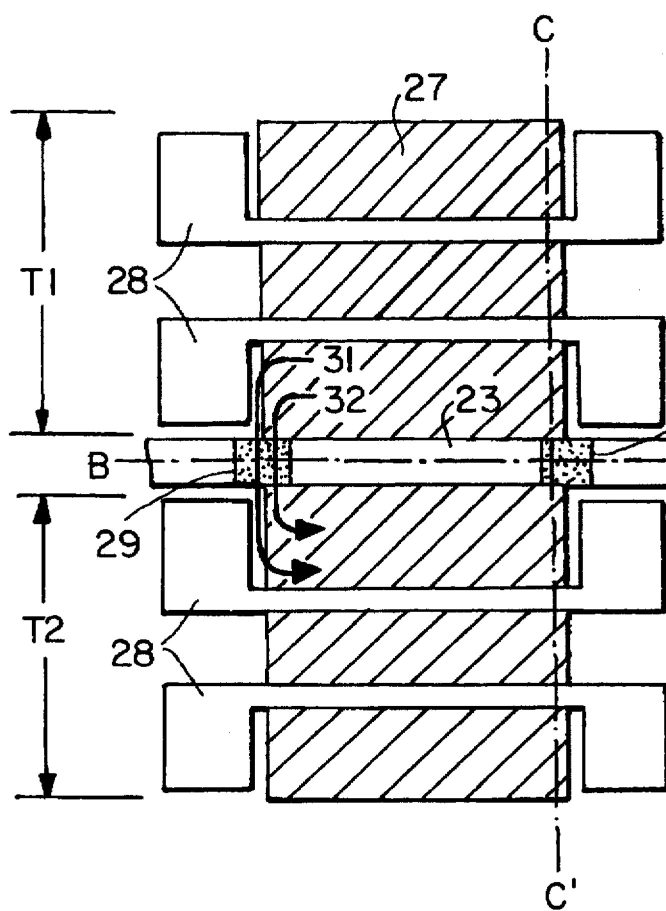
FIG.1(c)
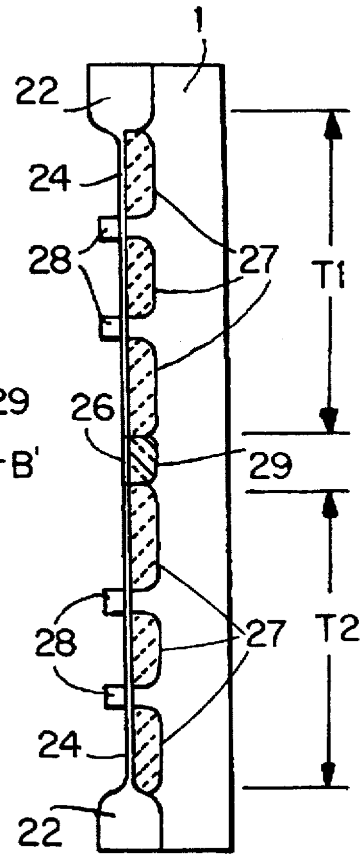
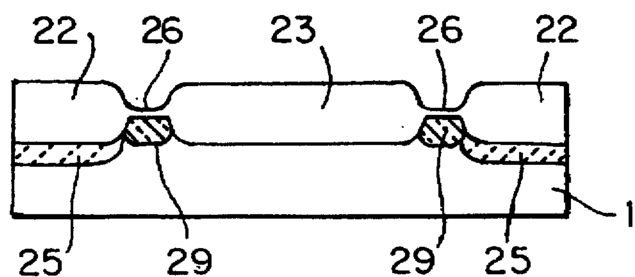
FIG.1(b)

1
2
3
4
5
6
7
10
11
12
13
14
26
27
28
29
34

TRANSISTOR FOR CHECKING RADIATION-HARDENED TRANSISTOR

BACKGROUND OF THE INVENTION

1. Field of the Invention

The present invention relates to a transistor for checking a radiation-hardened transistor and, particularly, to a transistor for checking an amount of impurity injected to a region of a radiation-hardened transistor in which a channel stopper is formed.

2. Description of the Prior Art

In a MOS LSI to be used in a radiative environment such as space, there is a problem of degradation of characteristics of a transistor due to radiation, such as variation of threshold voltage thereof and/or increase of leakage current thereof. Such degradation of transistor characteristics occurs because of radiation-caused accumulation of fixed positive charge in a silicon oxide film of the transistor and/or radiation-caused increase of interface state of an oxide film-silicon interface.

It has been known that a larger the thickness of an oxide film accumulates a larger the amount of fixed charge. The amount of fixed charge accumulated in a field oxide film which is thicker than a gate oxide film is larger than that accumulated in the gate oxide film. In the field oxide film, portions thereof which are closer to a wiring and gate electrodes of the transistor accumulate a larger amount of charge. Threshold voltage of a parasitic transistor existing in an area between two source-drain regions of a transistor which are separated from each other by a field oxide film is influenced by the amount of charge accumulated in the field oxide film. Therefore, when the transistor is radiated and a large amount of fixed positive charge is accumulated in a field oxide film, the threshold voltage of the parasitic transistor is lowered and leakage current increases.

The present inventors proposed previously a transistor structure with which leakage current can be reduced. In detail, the transistor structure includes a field insulating film and a portion of the field insulating film in which electric charge tends to be accumulated is made thinner to reduce an amount of charge accumulated therein. However, when a metal wiring passes over the thinner insulating film, there is a possibility that leakage current flows by a parasitic transistor which uses the metal wiring as its gate. In order to solve this problem, according to the proposed transistor structure, a high density impurity region is formed beneath the thinner insulating film as a channel stopper to increase threshold voltage of the parasitic transistor.

In the proposed transistor structure, there is a possibility that leakage current flows when an ion injection for forming the channel stopper is not performed normally. However, there has been no means for checking an amount of ion injected into the channel stopper.

BRIEF SUMMARY OF THE INVENTION

1. Object of the Invention

Therefore, an object of the present invention is to provide a transistor capable of checking an amount of impurity injected into a region of a radiation-hardened transistor in which a channel stopper of the radiation-hardened transistor is to be formed.

2. Summary of the Invention

A checking transistor for checking an amount of impurity injected into a region of a radiation-hardened transistor in which a channel stopper is to be formed, according to the present invention, is provided in a semiconductor chip having a first field oxide film for separating a plurality of usual transistors from each other, a second field oxide film formed in the first field oxide film and having thickness smaller than that of the first field oxide film, a first impurity region of one conductivity type provided below the second field oxide film and an interlayer insulating film provided on the first and second field oxide films.

The transistor for checking includes a source region of the other conductivity type and a drain region of the other conductivity type which are formed on a semiconductor substrate of one conductivity type through the same steps as those used to form source/drain regions of the usual transistors, a second impurity region of one conductivity type formed between the source region of the other conductivity type and the drain region of the other conductivity type through the same steps as those used to form the first impurity region of the one conductivity type, an oxide film having the same thickness as that of the second field oxide film and provided on the source region of the other conductivity type, the drain region of the other conductivity type and the second impurity region of the one conductivity type, an insulating film provided on the insulating film and having the same thickness as that of the interlayer insulating film and a gate electrode provided on the insulating film.

BRIEF DESCRIPTION OF THE DRAWINGS

This above-mentioned and other objects, features and advantages of the present invention will become more apparent by reference to the following detailed description of the invention taken in conjunction with the accompanying drawings, wherein:

FIG. 1(*a*) is a plan view of a radiation-hardened transistor chip to be checked by a checking transistor according to the present invention;

FIGS. 1(*b*) and 1(*c*) are cross sections of the radiation-hardened transistor shown in FIG. 1(*a*), which are taken along lines B—B' and C—C', respectively;

DETAILED DESCRIPTION OF THE INVENTION

Figure 2:
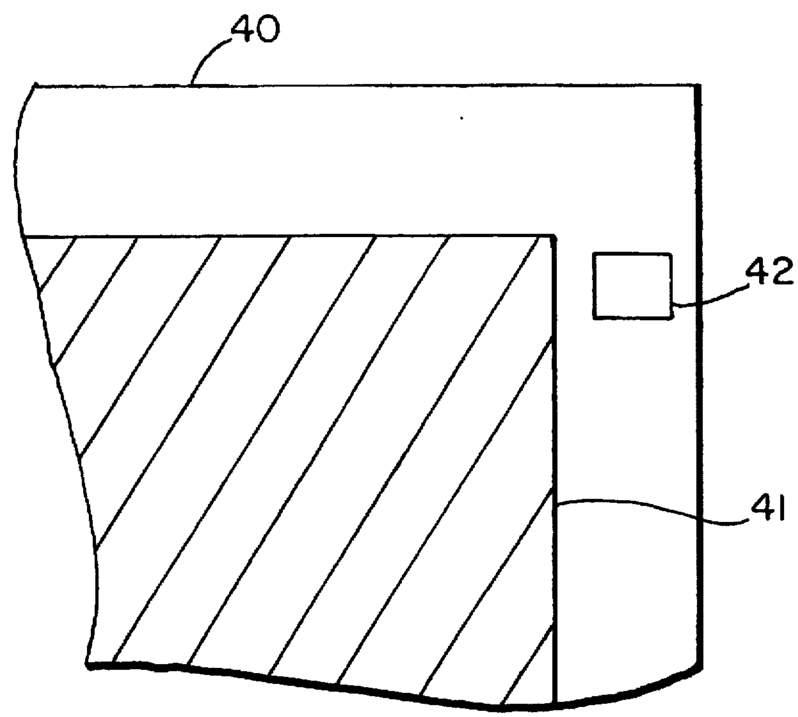
FIG. 2 is a plan view of the checking transistor provided according to the present invention, showing a position thereof on the chip.

A radiation-hardened transistor to be checked by a checking transistor according to the present invention will be described with reference to FIGS. 1(*a*), 1(*b*) and 1(*c*). In FIGS. 1(*a*), 1(*b*) and 1(*c*), a first transistor forming region T1 and a second transistor forming region T2 on a P type semiconductor substrate 1 are separated from each other by field oxide films 22, 23 and 26. MOS transistors are formed by N type source-drain regions 27, a gate oxide film 24 and gate electrodes 28 formed in each of the first and second transistor forming regions T1 and T2. A $P^+$-type impurity region which becomes a first channel stopper is denoted by a reference numeral 25.

As shown in FIG. 1(*b*), a thin oxide film 26 exists between the field oxide films 22 and 23. The thickness of the oxide film 26 is the same as that of the gate oxide film 24. A $P^+$-type impurity region 29 which becomes a second channel stopper is formed below the thin oxide film 26. Reasons for providing the thin oxide film 26 and the $P^+$-type impurity region 29 will be described.

A larger the amount of fixed positive charge accumulated in a silicon oxide film due to radiation accumulates in the thicker the oxide film, as mentioned previously. Therefore, an amount of fixed positive charge accumulated in the thick field oxide films 22 and 23 is large compared with that of the thin gate oxide film and, in the field oxide film, portions thereof which are closer to a wiring and gate electrodes of the transistor accumulate a larger amount of charge. If there is no thin oxide film 26 and the thickness of the whole oxide film is equal to that of the field oxide film 23, fixed positive charge is accumulated in the field oxide film 23 concentrically, particularly, in the vicinity of the gate electrode 28. Threshold voltage of a parasitic transistor in a portion of the field oxide film in which charge is concentrated is lowered, so that leakage current such as shown by a reference numeral 31 in FIG. 1(*a*) may flow.

By making the thickness of the portion of the field oxide film 26 in which fixed positive charge tends to be accumulated thin, the amount of charge accumulated therein is reduced and leakage current can be prevented from flowing.

On the other hand, if a metal wiring passes over the thin field oxide film 26, leakage current flows by a parasitic transistor which uses the metal wiring as its gate, as shown by a reference numeral 32 in FIG. 1(*a*) This leakage current flows regardless of presence or absence of radiation. In order to solve this problem, the $P^+$-type impurity region 29 is formed below the thin field oxide film 26 to increase threshold voltage of the parasitic transistor to thereby prevent leakage current from flowing.

The $P^+$-type impurity region 25 which becomes the channel stopper with respect to other element regions which are not shown is formed in a position remote enough from the source-drain region 27 to prevent a junction breakdown voltage from being lowered. On the other hand, the $P^+$-type impurity region 29 is set such that its impurity density is higher than that of the substrate 1 and lower than that of the $P^+$-type impurity region 25, since it is in contact with the source-drain region 27.

The $P^+$-type impurity region 25 is formed by injecting boron to the silicon substrate 1 with a concentration of $10^{19}$–$10^{20}$ $cm^{-3}$, while the $P^+$-type impurity region 29 may be formed by injecting boron with a concentration of in the order of $10^{18}$ $cm^{-3}$.

In the transistor mentioned above, when the ion injection for forming the $P^+$-type impurity region 29 is not performed normally, there is a possibility that the threshold voltage of the parasitic transistor is lowered and leakage current flows. The present inventors invented a checking transistor capable of checking an impurity concentration of the $P^+$-type impurity region 29 which is a second channel stopper.

As shown in FIG. 2, at least one checking transistor 42 of the present invention is provided in a peripheral portion of a semiconductor chip 40. The checking transistor 42 is formed independently from a region 41 which is provided within the chip and in which the usual transistors are formed and the checking transistor is not electrically connected to other elements including the usual transistors.

Figure 3:
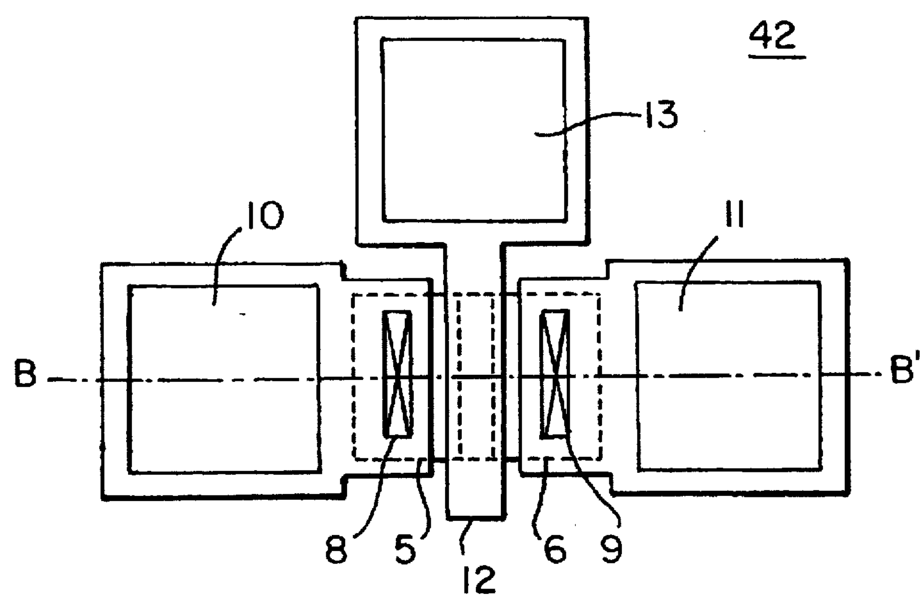
FIG. 3 is a plan view of the checking transistor according to the present invention.

As shown in FIG. 3, the checking transistor 42 is constructed with source-drain regions 5 and 6, aluminum pads 10 and 11 connected to the source-drain regions through contact holes 8 and 9, respectively, and a pad 13 connected to a gate electrode 12.

Figure 4:
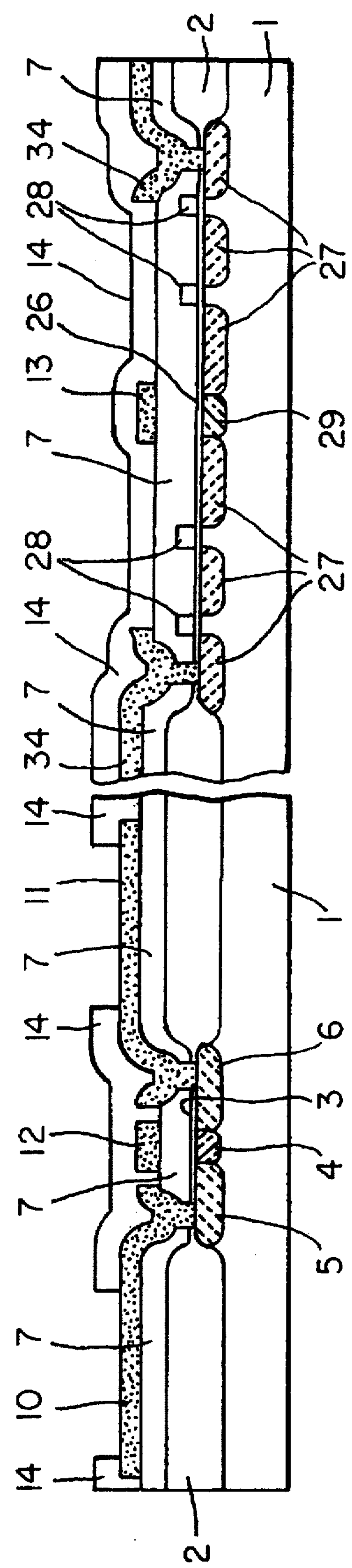
FIG. 4 is a cross section of the checking transistor according to the present invention and a usual transistor combined on the chip.

The construction of the checking transistor will be described in more detail with reference to FIG. 4. In FIG. 4, the plurality of usual transistors and field oxide film which are formed in the transistor forming region 41 shown in FIG. 2 are also shown for a reference. The structure of the usual transistor is the same as that shown in FIG. 1(*c*).

The checking transistor shown in the left side portion of FIG. 4 is formed through the same steps as those used to form the usual transistor shown in the right side portion of FIG. 4. That is, the source-drain regions 5 and 6, a $P^+$-type impurity region 4 which becomes a channel region, an oxide film 3 provided on the $P^+$-type impurity region 4, an interlayer insulating film 7 provided on the oxide film 3 and the gate electrode 12 of the checking transistor are formed simultaneously with the source-drain regions 27, the $P^+$-type impurity region 29, the thin field oxide film 26, the interlayer insulating film 7 and the upper metal wiring 33 of the usual transistor, respectively, and a passivation film 14 is provided on a whole surface of the chip. The $P^+$-type impurity region 4 and the $P^+$-type impurity region 29 are formed such that at least the channel lengths thereof becomes equal.

With such construction, the checking transistor becomes identical in impurity concentration of the channel region, channel length and thickness of the gate insulating film to the parasitic transistor formed in the insulating portion of the usual transistor, that is, the parasitic transistor having the upper layer metal wiring as a gate electrode, the source-drain region 27 as a source-drain and the $P^+$-type impurity region 29 as a channel region. Therefore, the checking transistor and the parasitic transistor have the same threshold voltage. In other words, it is possible to know the threshold voltage of the parasitic transistor by checking the threshold voltage of the checking transistor. If the threshold voltage of the checking transistor is abnormal, an existence of erroneous formation of the $P^+$-type impurity region 29 due to some defect in the ion injecting process is detected.

For example, when a power source voltage of 5 V is applied to the aluminum pad 11 and a current (1 μA or more) flows through the aluminum pad 11, a voltage applied to the aluminum pad 13 may be measured as the threshold voltage. If the threshold voltage is low, leakage current is generated by the parasitic transistor.

On the other hand, there may be a case where it is impossible to measure the threshold voltage since there is no current even when a high voltage (for example, 50 V) is applied to the aluminum pad 13. However, since it indicates that the parasitic transistor is inoperative, it is possible to know that no leakage current is generated.

Although the present invention has been described with reference to specific embodiments, this description is not meant to be construed in a limiting sense. Various modifications of the disclosed embodiments will become apparent to persons skilled in the art upon reference to the description of the present invention. It is therefore contemplated that the appended claims will covet any modifications or embodiments as fall within the true scope of the present invention.

What is claimed is:

1. A checking transistor for checking selected regions of semiconductor substrate containing radiation-hardened semiconductor circuitry having a plurality of transistors, a first field oxide film for separating a plurality of said transistors, a second field oxide film, said second field oxide film being thinner than said first field oxide film, a first impurity region of one conductivity type provided below said second field oxide film, an interlayer insulating film provided on said first and second field oxide films and a first gate electrode over said interlayer insulating film, said checking transistor comprising:

a source region of the other conductivity type and a drain region of the other conductivity type formed on said semiconductor substrate through the same fabrication steps as those used to fabricate source and drain regions of said transistors;

a second impurity region of the one conductivity type formed between said source region of the other conductivity type and said drain region of the other conductivity type through the same fabrications steps as those used to fabricate said first impurity region of the one conductivity type;

an oxide film on said source region of the other conductivity type, said drain region of the other conductivity type and said second impurity region of the one conductivity type, said oxide film having the same thickness as that of said second field oxide film;

an insulating film provided on said oxide film, said insulating film having the same thickness as that of said interlayer insulating film; and a second gate electrode provided on said insulating film.

2. A checking transistor as claimed in claim 1, further comprising a first electrode pad connected to said second gate electrode and second and third electrode pads connected to said source region of the other conductivity type and said drain region of the other conductivity type through contact holes, respectively.

3. A checking transistor as claimed in claim 1, wherein said second gate electrode is formed through the same fabrication step as that used to form said first gate electrode on said interlayer insulating film.

4. A checking transistor as claimed in claim 1, wherein said checking transistor is provided in a peripheral portion of said semiconductor substrate and is electrically insulated from other elements in said semiconductor substrate.

5. A semiconductor chip comprising first and second transistors provided in a region of a semiconductor substrate of one conductivity type, a first field insulating film and a second field insulating film having a thickness smaller than that of said first field insulating film, an interlayer insulating film provided over said first and second transistors, an impurity region of the one conductivity type provided below said second field insulating film and a checking transistor provided in a different region of said semiconductor substrate of the one conductivity type from said region in which said first and second transistors are provided, wherein an impurity concentration of source and drain regions of said checking transistor is the same as that of source and drain regions of said first and second transistors, and impurity concentration of a channel region of said checking transistor is the same as that of said impurity region of the one conductivity type, a channel length of said checking transistor is the same as a length of said impurity region of the one conductivity type and thickness of a gate insulating film of said checking transistor is a sum of thickness of said second field insulating film and thickness of said interlayer insulating film provided on said first and second transistors.

6. A semiconductor chip as claimed in claim 5, further comprising a first electrode pad connected to a gate electrode of said checking transistor and second and third electrode pads connected to said source region and said drain region of said checking transistor through contact holes, respectively.

* * * * *